United States Patent
Nojima et al.

(10) Patent No.: US 12,139,655 B2
(45) Date of Patent: Nov. 12, 2024

(54) QUANTUM DOT, WAVELENGTH CONVERSION MATERIAL, BACKLIGHT UNIT, IMAGE DISPLAY DEVICE, AND METHOD FOR MANUFACTURING QUANTUM DOT

(71) Applicant: SHIN-ETSU CHEMICAL CO., LTD., Tokyo (JP)

(72) Inventors: Yoshihiro Nojima, Annaka (JP); Shinji Aoki, Annaka (JP); Kazuya Tobishima, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 62 days.

(21) Appl. No.: 17/603,374

(22) PCT Filed: Feb. 10, 2020

(86) PCT No.: PCT/JP2020/005043
§ 371 (c)(1),
(2) Date: Oct. 13, 2021

(87) PCT Pub. No.: WO2020/217649
PCT Pub. Date: Oct. 29, 2020

(65) Prior Publication Data
US 2022/0204845 A1    Jun. 30, 2022

(30) Foreign Application Priority Data
Apr. 26, 2019 (JP) .................. 2019-086511

(51) Int. Cl.
*C09K 11/88* (2006.01)
*C09K 11/08* (2006.01)
(Continued)

(52) U.S. Cl.
CPC ........ *C09K 11/883* (2013.01); *C09K 11/0883* (2013.01); *C09K 11/621* (2013.01);
(Continued)

(58) Field of Classification Search
CPC ..... C09K 11/00; C09K 11/623; C09K 11/883; C09K 11/62; C09K 11/582
See application file for complete search history.

(56) References Cited

U.S. PATENT DOCUMENTS 9,834,724 B2 * 12/2017 Kim ................. C09K 11/61
2005/0287691 A1 * 12/2005 Chen ............ H01L 21/02409
                                                        257/E21.464
(Continued)

FOREIGN PATENT DOCUMENTS

CN      102212363 A      10/2011
CN      106590624 A       4/2017
(Continued)

OTHER PUBLICATIONS

Yang, Y. et al., "Radial-Position-Controlled Doping in CdS/ZnS Core/Shell Nanocrystals," J. Am. Chem. Soc., 2006, vol. 128, No. 38, pp. 12420-12428.
(Continued)

*Primary Examiner* — Matthew E. Hoban
(74) *Attorney, Agent, or Firm* — Oliff PLC (57) ABSTRACT

A quantum dot has a fluorescent crystalline nanoparticle, wherein the quantum dot has a core-shell structure including a core particle containing a first metal element and a shell layer containing a second metal element, at an interface between the core particle and the shell layer, a third metal element different from the first metal element and the second metal element is present, and an amount of the third metal element with respect to an amount of the first metal element contained in the core particle is 10% or less in terms of molar
(Continued)

ratio. As a result the quantum dot has excellent controllability of the emission wavelength and high luminous properties and luminous efficiency.

10 Claims, 1 Drawing Sheet

(51) Int. Cl.
| | |
|---|---|
| C09K 11/58 | (2006.01) |
| C09K 11/62 | (2006.01) |
| C09K 11/70 | (2006.01) |
| B82Y 20/00 | (2011.01) |
| B82Y 40/00 | (2011.01) |
| H01L 33/50 | (2010.01) |

(52) U.S. Cl.
CPC .......... *C09K 11/623* (2013.01); *C09K 11/703* (2013.01); *B82Y 20/00* (2013.01); *B82Y 40/00* (2013.01); *H01L 33/50* (2013.01)

(56) References Cited

U.S. PATENT DOCUMENTS

| | | | | |
|---|---|---|---|---|
| 2007/0194279 | A1* | 8/2007 | Peng | C09K 11/883 977/773 |
| 2008/0012031 | A1* | 1/2008 | Jang | C09K 11/08 257/89 |
| 2010/0055462 | A1* | 3/2010 | Cao | H01L 21/40 977/773 |
| 2010/0167011 | A1 | 7/2010 | Dubrow | |
| 2012/0175588 | A1* | 7/2012 | Qiao | C09K 11/883 977/774 |
| 2013/0299772 | A1* | 11/2013 | Cohen | H01L 29/365 438/542 |
| 2018/0258553 | A1 | 9/2018 | Ono | |
| 2019/0112527 | A1 | 4/2019 | Moriyama et al. | |
| 2019/0264103 | A1 | 8/2019 | Ono et al. | |

FOREIGN PATENT DOCUMENTS

| | | |
|---|---|---|
| CN | 108350355 A | 7/2018 |
| JP | 2010-535262 A | 11/2010 |
| JP | 2013-544018 A | 12/2013 |
| JP | 2015-127362 A | 7/2015 |
| KR | 10-2008-0006906 A | 1/2008 |
| WO | 2017/188300 A1 | 11/2017 |
| WO | 2018/092639 A1 | 5/2018 |

OTHER PUBLICATIONS

Luong, B. et al., "Green synthesis of highly UV-orange emitting ZnSe/ZnS:Mn/ZnS core/shell/shell nanocrystals by a three-step single flask method," RSC Advances, 2012, vol. 2, pp. 12132-12135.

Karan, N. et al., "Doping Transition Metal (Mn or Cu) Ions in Semiconductor Nanocrystals," The Journal of Physical Chemistry Letters, 2010, vol. 1, pp. 2863-2866.

Debnath, T. et al., "Recent Progress of Electron Storage Mn Center in Doped Nanocrystals," J. Phys. Chem., 2019, vol. 123, p. 10703-10719.

Apr. 14, 2020 International Search Report issued in International Patent Application No. PCT/JP2020/005043.

Sep. 28, 2021 International Preliminary Report on Patentability issued in International Patent Application No. PCT/JP2020/005043.

Nov. 22, 2022 Office Action issued in Japanese Patent Application No. 2021-515811.

Nov. 30, 2023 Office Action issued in Chinese Patent Application No. 202080030274.9.

Apr. 16, 2024 Office Action issued in Korean Patent Application No. 10-2021-7033310.

Jun. 6, 2024 Office Action issued in Chinese Patent Application No. 202080030274.9.

\* cited by examiner

QUANTUM DOT, WAVELENGTH CONVERSION MATERIAL, BACKLIGHT UNIT, IMAGE DISPLAY DEVICE, AND METHOD FOR MANUFACTURING QUANTUM DOT

TECHNICAL FIELD

The present invention relates to a quantum dot, a wavelength conversion material, a backlight unit, an image display device, and a method for manufacturing the quantum dot.

BACKGROUND ART

Semiconductor crystal particles with nanosized particle diameters are called quantum dots, and excitons generated upon light absorption are confined in nanosized region, so that energy level of the semiconductor crystal particles become discrete. Further, band gap changes depending on the particle diameter. Due to these effects, the fluorescence emission by quantum dots is brighter and more efficient than those by common fluorescent materials and exhibits sharp light emission. Moreover, based on such nature that the band gap varies depending on the particle diameter, quantum dots are characterized in that the emission wavelength is controllable and are expected to be applied as a wavelength conversion material for solid-state lighting and displays. For example, by using quantum dots as a wavelength conversion material in a display, it is possible to realize a wider color range and lower power consumption than conventional fluorescent materials.

There is proposed a method for assembling quantum dots for use as a wavelength conversion material, in which quantum dots are dispersed in a resin material and a resin material containing the quantum dots is laminated with a transparent film, then the laminated film is incorporated into a backlight unit as a wavelength conversion film (Patent Document 1).

CITATION LIST

Patent Literature

Patent Document 1: JP 2013-544018 T
Patent Document 2: JP 2010-535262 T

SUMMARY OF INVENTION

Technical Problem

However, there are problems in quantum dots, that is, particle size must be controlled in nanometer order in order to obtain desired wavelength, since band gap changes depending on particle size and emission wavelength shifts, further, the light emission becomes broad as particle size distributes. Quantum dots are generally synthesized as colloidal particles by reacting precursors in solution, but it is not easy to precisely control the particle size in nanometer size in solution reaction. Further, it becomes more difficult to control the particle size due to problems of precursor concentration unevenness and temperature distribution in the solution reaction, when scaled up for industrialization.

Further, in general, when controlling the emission wavelength, for example, in case to shift the emission wavelength to longer wavelength side, reaction time is lengthened or reaction temperature is raised in the synthesis of core particles to increase the particle size. However, in such a method, since particle growth varies due to long reaction time, particle size distribution becomes wide, light emission becomes broad, and color reproducibility deteriorates when used as a wavelength conversion material. In addition, by increasing the reaction temperature, chemical reaction rate becomes faster, which makes it difficult to control nuclear generation reaction and nuclear growth reaction, and as a result, resulting particles tend to distribute, and the light emission becomes broad as well. Therefore, when it is used as a wavelength conversion material, it causes degrade in color reproducibility.

On the other hand, when trying to shift the emission wavelength to shorter wavelength side, contrary to the above, there is a method of shortening the reaction time or lowering the reaction temperature to reduce the particle size in the synthesis of core particles. Even in such a method, there is a problem that by lowering the reaction temperature, crystallinity of the produced core particles becomes deteriorate, crystal defects are likely to generate, and the luminous efficiency is lowered.

To solve such a problem, a method of synthesizing quantum dots using molecular cluster composed of constituent elements of quantum dots as a seed for particle growth has been studied (Patent Document 2).

However, since the method described in Patent Document 2 uses a compound such as an organometallic complex which is a molecular cluster, it is difficult to arbitrarily change the composition, ratio, and the like. Further, since the reaction temperature depends on decomposition temperature and reactivity of the molecular cluster, there is a limit to control of the emission wavelength by managing the particle size arbitrarily.

The present invention has been made to solve the above problems, and an object of the present invention is to provide quantum dots having excellent controllability of emission wavelength and high luminous properties and luminous efficiency. Another object of the present invention is to provide a method for producing quantum dots, which has high luminous properties and luminous efficiency, and whose emission wavelength can be easily controlled.

Solution to Problem

To achieve the object, the present invention provides a quantum dot comprising fluorescent crystalline nanoparticle, wherein the quantum dot has a core-shell structure including a core particle containing a first metal element and a shell layer containing a second metal element, at an interface between the core particle and the shell layer, a third metal element different from the first metal element and the second metal element is present, and an amount of the third metal element with respect to an amount of the first metal element contained in the core particle is 10% or less in terms of molar ratio.

According to such a quantum dot, the controllability of the emission wavelength is easy and excellent, and the luminous properties and the luminous efficiency are high.

At this time, the third metal element can be at least one selected from Cu, Ag, Mn, Al, Ga, Ge, Si, Bi, Cs, Sn, Fe, Co, Ni, Cr, Li, Na, K, Ca, Mg and Mo.

As a result, the controllability of the emission wavelength is easier and more excellent, and the luminous properties and the luminous efficiency are higher.

At this time, it is possible that the quantum dots do not contain Cd (cadmium).

As a result, they do not contain harmful substances and environmental load becomes low.

At this time, the core particles can be selected from InP, ZnSe, ZnTe, CuInS$_2$, and AgInS$_2$.

This makes it more suitable for optical devices in visible light region, such as displays and lightings.

At this time, a wavelength conversion material containing the quantum dots of the present invention, a backlight unit including the wavelength conversion material, and an image display device including the backlight unit can be made.

This makes it possible to provide a wavelength conversion material, a backlight unit, and an image display device having high luminous efficiency and good color reproducibility.

Further, it is provided a method for producing a quantum dot comprising fluorescent crystalline nanoparticle, and having a core-shell structure including a core particle containing a first metal element and a shell layer containing a second metal element, the method comprising:
  a step of forming the core particle;
  a step of adsorbing a third metal element different from the first metal element and the second metal element on a surface of the core particle; and
  a step of forming the shell layer on the third metal element on the surface of the core particle, wherein an amount of the third metal element with respect to an amount of the first metal element contained in the core particle is set to 10% or less in terms of molar ratio in the step of adsorbing the third metal element.

This makes it possible to manufacture quantum dots having high luminous properties and luminous efficiency while easily controlling the emission wavelength.

At this time, a reaction temperature in the step of adsorbing the third metal element is set to be equal to or lower than a reaction temperature in the step of forming the core particle.

This makes it possible to manufacture quantum dots having higher luminous properties and luminous efficiency.

Advantageous Effects of Invention

As described above, according to the quantum dots of the present invention, the controllability of the emission wavelength is easy and excellent, and the luminous properties and luminous efficiency are high. Further, according to the method for producing quantum dots of the present invention, it is possible to produce quantum dots having high luminous properties and luminous efficiency while easily controlling the emission wavelength.

DESCRIPTION OF EMBODIMENTS

Hereinafter, the present invention will be described in detail, but the present invention is not limited thereto.

As described above, there has been a demand for quantum dots having excellent controllability of emission wavelength, high luminous properties and luminous efficiency.

As a result of diligent studies on the above-mentioned problems, inventors of the present invention have obtained a quantum dot, which comprises fluorescent crystalline nanoparticle, wherein the quantum dot has a core-shell structure including a core particle containing a first metal element and a shell layer containing a second metal element, at an interface between the core particle and the shell layer, a third metal element different from the first metal element and the second metal element is present, and an amount of the third metal element with respect to an amount of the first metal element contained in the core particle is 10% or less in terms of molar ratio, and found that the quantum dot provides excellent controllability of the emission wavelength and high luminous properties and luminous efficiency, and completed the present invention.

Further, there has been a demand for a method for producing quantum dots having high luminous properties and luminous efficiency, and easy controllability of the emission wavelength.

As a result of diligent studies on the above-mentioned problems, inventors of the present invention have obtained a method for producing a quantum dot, comprising fluorescent crystalline nanoparticle, and having a core-shell structure including a core particle containing a first metal element and a shell layer containing a second metal element, the method comprising:
  a step of forming the core particle;
  a step of adsorbing a third metal element different from the first metal element and the second metal element on a surface of the core particle; and
  a step of forming the shell layer on the third metal element on the surface of the core particle, wherein an amount of the third metal element with respect to an amount of the first metal element contained in the core particle is set to 10% or less in terms of molar ratio in the step of adsorbing the third metal element. The inventors of the present invention found the method can produce quantum dots having high luminous properties and luminous efficiency and easy controllability of the emission wavelength and completed the present invention.

Figure 1:
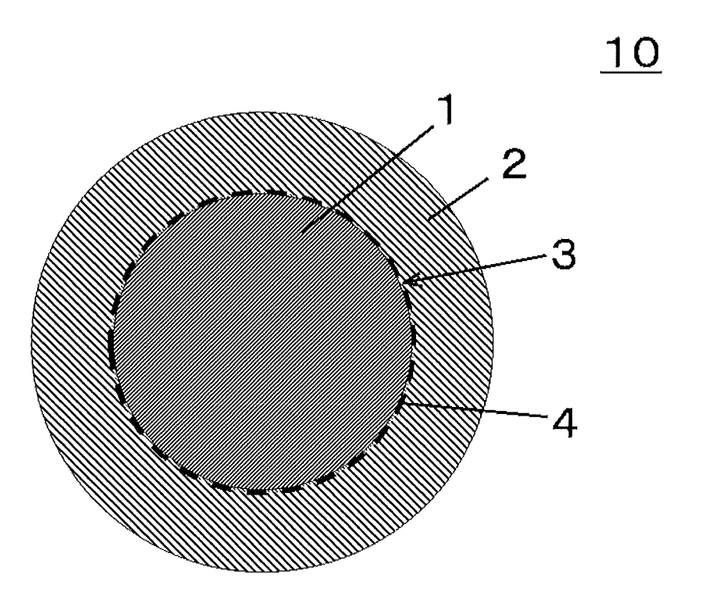
FIG. 1 shows a quantum dot according to the present invention.

As shown in FIG. 1, the quantum dot 10 according to the present invention has a core-shell structure including a core particle 1 containing a first metal element and a shell layer 2 containing a second metal element (also referred to as a "core shell type quantum dot"). There is a third metallic element 4, that is different from the element from a first metal element contained in the core particle 1 and a second metal element contained in the shell layer 2, at interface 3 between the core particle 1 and the shell layer 2 (also referred to as "core shell interface"). Further, the amount of the third metal element 4 with respect to the amount of the first metal element contained in the core particle 1 is 10% or less in terms of molar ratio.

Here, the first metal element, the second metal element, and the third metal element may contain not only one kind of metal element but also a plurality of kinds of metal elements, respectively.

The composition of the quantum dot is not particularly limited, and can be appropriately selected depending on the target wavelength conversion material and optical element. As the composition of quantum dot, a composition containing cadmium such as CdSe and CdS is generally used, but cadmium is a harmful substance and its use is strictly restricted by laws and regulations, so that it does not contain cadmium preferably.

The composition of the core particles of the core-shell type quantum dot is exemplified as follows: II-IV group semiconductor, III-V group semiconductor, II-VI group semiconductor, I-III-VI group semiconductor, II-IV-V group semiconductor, IV group semiconductor, perovskite type semiconductor and the like. Specifically, InP, InSb, AlP, AlSb, ZnSe, ZnS, ZnTe, Zn$_3$P$_2$, GaP, GaSb, CuInSe$_2$, $CuInS_2$, $CuInTe_2$, $CuGaSe_2$, $CuGaS_2$, $CuGaTe_2$, $CuAlSe_2$, $CuAlS_2$, $CuAlTe_2$, $AgInSe_2$, $AgInS_2$, $AgInTe_2$, $AgGaSe_2$, $AgGaS_2$, $AgGaTe_2$, Si, Ge, graphene, $CsPbCl_3$, $CsPbBr_3$, $CsPbI_3$, $CH_3NH_3PbCl_3$ and mixed crystals thereof. If the target optical element is an optical device in the visible light region such as a display or lighting, InP, ZnTe, ZnSe, $AgInS_2$, $CuInS_2$ and a mixed crystal thereof are particularly preferable in consideration of the emission wavelength region.

Examples of the composition of the shell layer of the core-shell type quantum dots include ZnSe, ZnS, AlP, AlN, GaN, $Ga_2S_3$, MgSe, and MgS. The shell layer may be one layer or two or more layers, and can be appropriately changed depending on the composition and purpose of the core particles.

The size and shape of the core particles and the shell layer are not particularly limited, and can be appropriately selected according to the desired emission wavelength and properties.

In the core-shell type quantum dot, by adding a third metal element different from a first metal element contained in the core particles and the second metal element contained in the shell layer to the core-shell interface, luminous efficiency can be improved due to suppression of defect by filling the lattice defect portion such as the dangling bond generated from a lattice mismatch of the core-shell interface with the third metal element and compensation for the charge accompanying the generation of the defect by the third metal element. Further, the energy level at the core-shell interface changes depending on the combination of the composition of the core particles and the third metal element, and the emission wavelength can be shifted to a short wavelength or a long wavelength without changing the particle size of the quantum dots. This makes it possible to control the emission wavelength.

It can be appropriately selected from Cu, Ag, Mn, Al, Ga, Ge, Si, Bi, Cs, Sn, Fe, Co, Ni, Cr, Li, Na, K, Ca, Mg and Mo according to the composition of the quantum dots and the desired properties, as a third metal element different from the metal element contained in the core particles and the shell layer. The third metal element may be one kind or a combination of a plurality of metal elements.

As a method for adsorbing the third metal element on the core particles, a compound such as a halide, an acetate, a carboxylate, or an organo-metallic complex of each metal element is dissolved in an organic solvent as a precursor, and the solution is dropped into a solution in which the core particles are dispersed. The types of these compounds and solvents are not particularly limited and can be appropriately selected according to the material system and reaction conditions. The reaction temperature when the third metal element is adsorbed on the core particles is not particularly limited, but it is preferably below the temperature that the reaction of the core particles so as to suppress the change in characteristics such as the particle size of the core particles during the reaction of the third metal element. The reaction time can be appropriately selected according to the reactivity of the precursor compound and the desired characteristics.

The amount of the third metal element added to the core-shell interface is 10% or less in terms of the molar ratio to the first metal element constituting the core particles. If the amount added exceeds 10%, following problems are occurred, a by-product of the third metal element is generated, the third metal element itself generates new particles, luminous property is deteriorated due to large change of energy level of the quantum dot owing to excessive incorporation into the core surface, or it becomes difficult to form a shell layer on the surface. The lower limit of the amount of the third metal element is not particularly limited and may be an amount intentionally added, but it is preferably 0.1% (molar ratio) or more. The effect of the present invention cannot be exerted in an amount that is inevitably present.

The method for producing quantum dots according to the present invention comprises a step of forming core particles, a step of adsorbing a third metal element that is different from a first metal element contained in the core particles and a second metal element contained in a shell layer on the surface of the core particles, a step of forming a shell layer on the third metal element on the surface of the core particle, and the amount of the third metal element is 10% or less with respect to the amount of the first metal element contained in the core particle in terms of molar ratio. Further, it is preferable that the reaction temperature in the step of adsorbing the third metal element is equal to or lower than the reaction temperature in the step of forming the core particles.

Other conditions in the method for producing quantum dots are not particularly limited, and can be appropriately selected depending on the composition and the desired luminous properties. Further, a coating layer of an organic molecule, an inorganic molecule or a polymer may be provided on the surface of the quantum dot, the structure thereof is not limited, and the thickness of the coating layer can be appropriately selected according to the purpose. The thickness of the coating layer is not particularly limited, but it is desirable that the thickness is such that the particle size of the quantum dots is less than 100 nm. When the thickness of the coating layer is in such a range, the dispersibility is more stable, so that the light transmittance is more stable. In addition, such quantum dots are less likely to agglomerate.

As the coating layer, organic molecules such as stearic acid, oleic acid, palmitic acid, dimercaptosuccinic acid, oleylamine, hexadecylamine, octadecylamine, and 1-dodecanethiol, polymers such as polyvinyl alcohol, polyvinylpyrrolidone, polysilsesquioxane, poly (methyl methacrylate), polyacrylonitrile, and polyethylene glycol, and inorganic molecules such as silica, alumina, titania, zirconia, zinc oxide, and gallium oxide are exemplified.

Further, a wavelength conversion material can be obtained from the quantum dots according to the present invention. Examples of the wavelength conversion material include, but are not limited to, uses such as wavelength conversion films and color filters. With the wavelength conversion material according to the present invention, it is possible to obtain a wavelength conversion material having a target emission wavelength, good color reproducibility, and good luminous efficiency.

The wavelength conversion film can be obtained by mixing the quantum dots according to the present invention with a resin to disperse the quantum dots in the resin. In this step, the quantum dots dispersed in a solvent can be added and mixed with the resin and dispersed in the resin. It is also possible to disperse the quantum dots in the resin by removing the solvent and adding the powdered quantum dots to the resin and kneading them. Alternatively, there is a method of polymerizing the monomers and oligomers of the resin components in the coexistence of quantum dots. The method for dispersing the quantum dots in the resin is not particularly limited, and can be appropriately selected depending on the intended purpose.

The solvent for dispersing the quantum dots is not particularly limited as long as it is compatible with the resin used. The resin material is not particularly limited, and a silicone resin, an acrylic resin, an epoxy resin, a urethane resin, or the like can be appropriately selected according to desired characteristics. In order to increase the efficiency as wavelength conversion materials, it is desirable that the transmittance of these resins is high, and it is particularly desirable that the transmittance is 80% or more.

Further, a substance other than quantum dots may be contained, and fine particles such as silica, zirconia, alumina, and titania may be contained as a light scatterer, and an inorganic fluorescent or an organic fluorescent may also be contained. Inorganic fluorescent include YAG, LSN, LYSN, CASN, SCASN, KSF, CSO, β-SIALON, GYAG, LuAG, SBCA, and organic fluorescent include perylene derivatives, anthraquinone derivatives, anthracene derivatives, phthalocyanine derivatives, cyanine derivatives, dioxazine derivatives, benzooxadinone derivatives, coumarin derivatives, quinophthalone derivatives, benzoxazole derivatives, pyrarizone derivatives and the like are exemplified.

The method for producing the wavelength conversion material according to the present invention is not particularly limited, and can be appropriately selected depending on the intended purpose. For example, a wavelength conversion material can be obtained by coating a resin composition in which quantum dots are dispersed in a resin to a transparent film such as PET or polyimide, curing the resin composition, and laminating the resin composition.

For coating on the transparent film, a spray method such as spray or inkjet, a spin coat or bar coater, a doctor blade method, a gravure printing method or an offset printing method can be used, and a resin layer can be formed by coating. The thickness of the resin layer and the transparent film is not particularly limited and can be appropriately selected depending on the intended use.

One embodiment of the wavelength conversion material according to the present invention is a backlight unit in which the wavelength conversion film is installed on a light guiding panel surface to which a blue LED is coupled. Another embodiment is an image display device in which the wavelength conversion film is arranged between a light guiding panel surface to which a blue LED is coupled and a liquid crystal display panel. In these embodiments, the wavelength conversion film absorbs at least a part of the blue light of the primary light as a light source and emits secondary light having a wavelength longer than that of the primary light, so that it can be converted into light having an arbitrary wavelength distribution depending on the emission wavelength of quantum dots.

EXAMPLE

Hereinafter, the present invention will be specifically described with reference to Examples and Comparative Examples, but this does not limit the present invention.

The fluorescence emission characteristics of the produced quantum dots were evaluated using a quantum efficiency measurement system (QE-2100 manufactured by Otsuka Electronics) with an excitation wavelength of 450 nm.

Comparative Example 1

Step 1: Synthesis of InP Core Particles 10 mL of 1-octadecene as a solvent, 200 mg of indium acetate, and 450 mg of myristic acid were put into a 100 mL three-necked flask, and degassing treatment was performed at 120° C. for 2 hours. After degassing, the inside of the flask was filled with nitrogen gas, and the reaction was carried out in a state where oxygen was blocked. This solution was heated to 280° C., and 1.5 mL of tris (trimethylsilyl) phosphine diluted 10-fold with 1-octadecene was quickly added dropwise to the stirred solution and reacted at 280° C. for 20 minutes to synthesize InP core particles.

Step 2: Formation of ZnS Shell Layer 36 mg of sulfur powder was added to 6 mL of trioctylphosphine, and the mixture was heated and stirred at 150° C. to dissolve the sulfur powder to prepare a sulfur solution. A zinc solution was prepared by adding 270 mg of anhydride zinc acetate, 2 mL of oleic acid and 1 mL of oleic amine to 7 mL of 1-octadecene and similarly degassing at 150° C. to dissolve acetic anhydride. Next, while maintaining the solution of InP core particles obtained in step 1 at 280° C., a sulfur solution was added dropwise and the mixture was stirred for 30 minutes. Further, the solution temperature was set to 300° C., a zinc solution was added dropwise, and the reaction was carried out at 300° C. for 60 minutes. As a result, an InP/ZnS core-shell type quantum dot solution was obtained.

5 times by volume of acetone was added to the quantum dot solution after the reaction to precipitate the quantum dots, and a centrifuge was used to perform centrifugation at 10000 rpm for 10 minutes, and the recovered precipitate was redispersed in toluene. The quantum dots were purified.

As a result of measuring the luminous properties of the quantum dots thus obtained, the emission wavelength was 521 nm, the half width of emission was 43 nm, and the internal quantum efficiency was 62%.

Example 1

After step 1 same as Comparative Example 1, 20 mg of copper (I) acetate, 6 mL of oleic acid, and 14 mL of 1-octadecene were mixed and degassed at 150° C. for 2 hours to prepare a copper solution in which copper acetate was dissolved. 1 mL of this copper solution was added dropwise to a solution in which core particles were synthesized by the same step 1 as in Comparative Example 1 while maintaining the temperature of the solution at 200° C., and the mixture was stirred at 200° C. for 30 minutes to adsorb Cu atoms on the surface of the core particles. Then, the same treatment as in step 2 above was carried out to obtain InP/ZnS quantum dots in which Cu was added to the core-shell interface. As a result of measuring the luminous properties of the quantum dots thus obtained, the emission wavelength was 536 nm, the half width of emission was 43 nm, and the internal quantum efficiency was 72%.

Example 2

Similar to Example 1, after the same step 1 as in Comparative Example 1, 20 mg of silver (I) acetate, 6 mL of oleic acid, and 14 mL of 1-octadecene were mixed and degassed at 150° C. for 2 hours to prepare a silver solution in which silver acetate was dissolved. 5 mL of this silver solution was added dropwise to the solution in which the core particles of Step 1 were synthesized in the same manner as in Comparative Example 1 while maintaining the temperature of the solution at 200° C., and the mixture was stirred at 200° C. for 30 minutes to adsorb Ag atoms on the surface of the core particles. Then, the same treatment as in Step 2 above was carried out to obtain InP/ZnS quantum dots in which Ag was added to the core-shell interface. As a result of measuring the luminous properties of the quantum dots thus obtained, the emission wavelength was 592 nm, the half width of emission was 44 nm, and the internal quantum efficiency was 75%.

Example 3

Similar to Example 1, after the same step 1 as in Comparative Example 1, 42 mg of calcium stearate, 12 mg of anhydrous gallium (III) chloride, 1 mL of oleylamine, 1 mL of oleic acid, and 8 mL of 1-octadecene were mixed and degassed at 170° C. for 2 hours to prepare a solution in which calcium stearate and anhydrous gallium chloride were dissolved. 1 mL of this solution was added dropwise to the solution in which the core particles of Step 1 were synthesized in the same manner as in Comparative Example 1 while maintaining the temperature of the solution at 200° C., and the mixture was stirred at 200° C. for 30 minutes to adsorb Ca and Ga atoms on the surface of the core particles. Then, the same treatment as in Step 2 above was carried out to obtain InP/ZnS quantum dots to which Ca and Ga were added to the core-shell interface. As a result of measuring the luminous properties of the quantum dots thus obtained, the emission wavelength was 495 nm, the half width of emission was 39 nm, and the internal quantum efficiency was 69%.

Example 4

Similar to Example 1, after the same step 1 as in Comparative Example 1, 100 mg of potassium stearate, 95 mg of sodium stearate, and 10 mL of 1-octadecene were mixed, degassed at 180° C. for 2 hours, to prepare a solution in which potassium stearate and sodium stearate were dissolved. 1 mL of this solution was added dropwise to the solution in which the core particles of Step 1 were synthesized in the same manner as in Comparative Example 1 while maintaining the temperature of the solution at 200° C., and the mixture was stirred at 200° C. for 30 minutes to adsorb K and Na on the surface of the core particles. Then, the same treatment as in Step 2 above was carried out to obtain InP/ZnS quantum dots in which K and Na were added to the core-shell interface. As a result of measuring the luminous properties of the quantum dots thus obtained, the emission wavelength was 515 nm, the half width of emission was 42 nm, and the internal quantum efficiency was 70%.

Example 5

Similar to Example 1, after the same step 1 as in Comparative Example 1, 22 mg of anhydrous magnesium (II) chloride, 1 mL of oleylamine, 1 mL of oleic acid, and 8 mL of 1-octadecene were mixed and degassed at 120° C. for 2 hours to prepare a solution in which anhydrous magnesium (II) chloride was dissolved. 2 mL of this solution was added dropwise to the solution in which the core particles of Step 1 were synthesized in the same manner as in Comparative Example 1 while maintaining the temperature of the solution at 200° C., and the mixture was stirred at 200° C. for 30 minutes to adsorb Mg atoms to the surface of the core particles. Then, the same treatment as in step 2 above was carried out to obtain InP/ZnS quantum dots in which Mg was added to the core-shell interface. As a result of measuring the luminous properties of the quantum dots thus obtained, the emission wavelength was 507 nm, the half width of emission was 40 nm, and the internal quantum efficiency was 66%.

Example 6

Similar to Example 1, after the same step 1 as in Comparative Example 1, a mixed solution of 5 mL of germanium (IV) chloride, 1 mL of oleylamine, and 4 mL of 1-octadecene was prepared. 5 mL of this solution was added dropwise to the solution in which the core particles of Step 1 were synthesized in the same manner as in Comparative Example 1 while maintaining the temperature of the solution at 200° C., and the mixture was stirred at 200° C. for 30 minutes to adsorb Ge atoms to the surface of the core particles. Then, the same treatment as in step 2 above was carried out to obtain InP/ZnS quantum dots in which Ge was added to the core-shell interface. As a result of measuring the luminous properties of the quantum dots thus obtained, the emission wavelength was 533 nm, the half width of emission was 38 nm, and the internal quantum efficiency was 68%.

Example 7

In Example 1, the reaction was carried out under the same conditions as in Example 1 except that the temperature at the time of adding the copper solution was changed to 300° C. to obtain InP/ZnS quantum dots in which Cu was added to the core-shell interface. As a result of measuring the luminous properties of the quantum dots thus obtained, the emission wavelength was 528 nm, the half width of emission was 50 nm, and the internal quantum efficiency was 63%.

Comparative Example 2

InP/ZnS core-shell particles were synthesized under the same conditions except that the synthesis temperature of the core particles in step 1 of Comparative Example 1 was changed to 310° C. As a result of measuring the luminous properties of the quantum dots thus obtained, the emission wavelength was 540 nm, the half width of emission was 55 nm, and the internal quantum efficiency was 60%.

Comparative Example 3

InP/ZnS core-shell particles were synthesized under the same conditions except that the synthesis temperature of the core particles in step 1 of Comparative Example 1 was changed to 250° C. As a result of measuring the luminous properties of the quantum dots thus obtained, the emission wavelength was 508 nm, the half width of emission was 45 nm, and the internal quantum efficiency was 53%.

Comparative Example 4

In step 1 of Comparative Example 1, 10 mL of 1-octadecene as a solvent, 200 mg of indium acetate, 450 mg of myristic acid and 1 mg of copper (I) acetate were added to a 100 mL three-necked flask, and degassing treatment was performed at 120° C. for 2 hours. After degassing, the inside of the flask was filled with nitrogen gas and the reaction was carried out in a state where oxygen was blocked. This solution is heated to 280° C., 1.5 mL of tris (trimethylsilyl) phosphine diluted 10-fold with 1-octadecene is quickly added dropwise to the stirred solution, and the reaction is carried out at 280° C. for 20 minutes to add Cu atoms to the core. Thus InP core particles were synthesized. A ZnS shell layer was formed on the obtained core particles under the same conditions as in step 2 of Comparative Example 1. As a result, InP/ZnS quantum dots in which Cu atoms were added into the core particles were obtained. As a result of measuring the luminous properties of the quantum dots thus obtained, the emission wavelength was 689 nm, the half width of emission was 77 nm, and the internal quantum efficiency was 70%.

Comparative Example 5

In Example 2, the reaction was carried out under the same conditions as in Example 2 except that the amount of the silver solution added was changed to 12.6 mL, to obtain InP/ZnS quantum dots in which Ag was added to the core-shell interface. As a result of measuring the luminous properties of the quantum dots thus obtained, the emission wavelength was 618 nm, the half width of emission was 52 nm, and the internal quantum efficiency was 70%.

Comparative Example 6

In Example 1, the reaction was carried out under the same conditions as in Example 1 except that the amount of the copper solution added was changed to 17 mL, to obtain InP/ZnS quantum dots in which Cu was added to the core-shell interface. As a result of measuring the luminous properties of the quantum dots obtained in this manner, the quantum dots having two peaks with emission wavelengths of 510 nm and 644 nm and half widths of emission of 49 nm and 75 nm, respectively, and the internal quantum efficiency of 56% as sum of two peaks is obtained.

The results of Examples 1-7 and Comparative Example 1-6 are shown in Table 1.

of the quantum dots, and the luminous efficiency is high, and good luminous properties can be obtained. Further, when Example 1 and Example 7 are compared, it can be seen that Example 1 has better luminous properties. In this way, by setting the reaction temperature when adsorbing the third metal element to the core particles to be equal to or lower than the reaction temperature when forming the core particles, it is possible to obtain quantum dots having better luminous properties.

Comparative Example 7

Step 3: Synthesis of ZnSeTe Core Particles 20 mL of 1-octadecene and 6.5 mL of oleic acid were put into a 100 mL three-necked flask as a solvent, and degassing treatment was performed at 120° C. for 30 minutes. After degassing, the inside of the flask was filled with nitrogen gas and the reaction was carried out in a state where oxygen was blocked. Further, 79 mg of selenium powder and 96 mg of tellurium powder were added to 20 mL of trioctylphosphine, and the mixture was heated and stirred at 150° C. to dissolve the selenium powder and tellurium powder to prepare a selenium-tellurium solution. 10 mL of this selenium-tellurium solution and 0.11 mL of diethylzinc were mixed under a nitrogen atmosphere, and this mixed solution was added dropwise to a flask heated to 250° C. and reacted at 250° C. for 30 minutes to synthesize ZnSeTe core particles.

Step 4: Formation of ZnS Shell Layer 0.07 mL of diethylzinc and 0.16 mL of 1-dodecanethiol are mixed with 6 mL of 1-octadecene, and this mixed

TABLE 1

| InP/ZnS | Added element (third metal element) | Added amount (molar ratio) | emission wavelengths | half widths of emission | internal quantum efficiency |
|---|---|---|---|---|---|
| Comparative Example 1 | None | — | 521 nm | 43 nm | 62% |
| Example 1 | Cu | 1.2% | 536 nm | 43 nm | 72% |
| Example 2 | Ag | 4.4% | 592 nm | 44 nm | 75% |
| Example 3 | Ca + Ga | 2.0% | 495 nm | 39 nm | 69% |
| Example 4 | K + Na | 9.0% | 515 nm | 42 nm | 70% |
| Example 5 | Mg | 6.7% | 507 nm | 40 nm | 66% |
| Example 6 | Ge | 3.2% | 533 nm | 38 nm | 68% |
| Example 7 | Cu | 1.2% | 528 nm | 50 nm | 63% |
| Comparative Example 2 | None | — | 540 nm | 55 nm | 60% |
| Comparative Example 3 | None | — | 508 nm | 45 nm | 53% |
| Comparative Example 4 | Cu (added in core) | 1.2% | 689 nm | 77 nm | 70% |
| Comparative Example 5 | Ag | 11.0% | 618 nm | 52 nm | 70% |
| Comparative Example 6 | Cu | 20.2% | 510 nm 644 nm | 49 nm 75 nm | 56% |

The reaction temperature during adsorption of Cu to core particles is different between Example 1 and Example 7.

The reaction temperature during core particle formation is different among Comparative Example 1 to Comparative Example 3.

As is clear from the comparison between Example 1-7 and Comparative Example 1-6, quantum dots can be obtained by adding the third metal element not contained in the core particle and shell layer at the core-shell interface, in an amount (molar ratio) of 10% or less, to the first metal element contained in the core particle, and the emission wavelength can be controlled without adjusting the diameter solution is added dropwise to the solution of ZnSeTe core particles obtained in step 3 above under a temperature condition of 240° C. The mixture was stirred for 30 minutes. As a result, a ZnSeTe/ZnS type quantum dot solution was obtained.

5 times by volume of acetone was added to the quantum dot solution after the reaction to precipitate the quantum dots, and a centrifuge was used to perform centrifugation at 10000 rpm for 10 minutes, and the recovered precipitate was redispersed in toluene. The quantum dots were purified.

As a result of measuring the luminous properties of the quantum dots thus obtained, the emission wavelength was 536 nm, the half width of emission was 38 nm, and the internal quantum efficiency was 12%.

Example 8

After the same step 3 as in Comparative Example 7, 20 mg of anhydrous aluminum (III) chloride, 2 mL of oleylamine, and 18 mL of 1-octadecene were mixed and degassed at 120° C. for 2 hours to prepare an aluminum solution in which anhydrous aluminum chloride was dissolved. 7 mL of this solution was added dropwise to the solution in which the core particles were synthesized by the same step 3 as in Comparative Example 7 while maintaining the temperature of the solution at 200° C., and the mixture was stirred at 200° C. for 30 minutes to adsorb Al atoms to the surface of the core particles. Then, the same treatment as in step 4 above was carried out to obtain ZnSeTe/ZnS quantum dots in which Al was added to the core-shell interface. As a result of measuring the luminous properties of the quantum dots thus obtained, the emission wavelength was 517 nm, the half width of emission was 35 nm, and the internal quantum efficiency was 20%.

Example 9

In the same manner as in Example 8, after the same step 3 as in Comparative Example 7, 20 mg of anhydrous manganese (II) chloride, 2 mL of oleylamine, and 18 mL of 1-octadecene were mixed, degassed at 150° C. for 2 hours to prepare a solution in which anhydrous manganese chloride was dissolved. 3 mL of this solution was added dropwise to the solution in which core particles were synthesized by the same step 3 as in Comparative Example 7 while maintaining the temperature of the solution at 200° C., and the mixture was stirred at 200° C. for 30 minutes to adsorb Mn atoms on the core surface. Then, the same process as in step 4 above was carried out to obtain ZnSeTe/ZnS quantum dots in which Mn was added to the core-shell interface. As a result of measuring the luminous properties of the quantum dots thus obtained, the emission wavelength was 581 nm, the half width of emission was 40 nm, and the internal quantum efficiency was 22%.

Comparative Example 8

ZnSeTe/ZnS core-shell type quantum dots were synthesized under the same conditions as in Comparative Example 7 except that the synthesis temperature of the core particles in Step 3 of Comparative Example 7 was changed to 280° C. As a result of measuring the luminous properties of the quantum dots thus obtained, the emission wavelength was 530 nm, the half width of emission was 44 nm, and the internal quantum efficiency was 10%.

Comparative Example 9

ZnSeTe/ZnS core-shell type quantum dots were synthesized under the same conditions as in Comparative Example 7 except that the synthesis temperature of the core particles in Step 3 of Comparative Example 7 was changed to 230° C. As a result of measuring the luminous properties of the quantum dots thus obtained, the emission wavelength was 530 nm, the half width of emission was 49 nm, and the internal quantum efficiency was 5%.

Comparative Example 10

20 mL of 1-octadecene as a solvent, 6.5 mL of oleic acid, and 3 mg of anhydrous manganese chloride were put into a 100 mL three-necked flask, and degassing treatment was performed at 120° C. for 2 hours. After degassing, the inside of the flask was filled with nitrogen gas, and the reaction was carried out in a state where oxygen was blocked. Further, 79 mg of selenium powder and 96 mg of tellurium powder were added to 20 mL of trioctylphosphine, and the mixture was heated and stirred at 150° C. to dissolve the selenium powder and tellurium powder to prepare a selenium-tellurium solution. Under a nitrogen atmosphere, 10 mL of this selenium-tellurium solution and 0.11 mL of diethylzinc were mixed, and the mixed solution was added dropwise to a flask heated to 250° C. and reacted at 250° C. for 30 minutes to synthesize ZnSeTe core particles. A ZnS shell layer was formed on the obtained core particles under the same conditions as in step 4 of Comparative Example 7. As a result, ZnSeTe/ZnS quantum dots in which Mn atoms were added into the core particles were obtained. As a result of measuring the luminous properties of the quantum dots thus obtained, the emission wavelength was 596 nm, the half width of emission was 58 nm, and the internal quantum efficiency was 32%.

Comparative Example 11

In Example 8, the reaction was carried out under the same conditions as in Example 8 except that the amount of the aluminum solution added was changed to 18 mL, to obtain ZnSeTe/ZnS quantum dots in which Al was added to the core-shell interface. As a result of measuring the luminous properties of the quantum dots thus obtained, the emission wavelength was 497 nm, the half width of emission was 60 nm, and the internal quantum efficiency was 8%.

The results of Examples 8 and 9 and Comparative Example 7-11 are shown in Table 2.

TABLE 2

| ZnSeTe/Zns | Added element (third metal element) | Added amount (molar ratio) | emission wave-lengths | half widths of emission | internal quantum efficiency |
|---|---|---|---|---|---|
| Comparative Example 7 | None | — | 536 nm | 38 nm | 12% |
| Example 8 | Al | 4.9% | 517 nm | 35 nm | 20% |
| Example 9 | Mn | 2.2% | 581 nm | 40 nm | 22% |
| Comparative Example 8 | None | — | 530 nm | 44 nm | 10% |
| Comparative Example 9 | None | — | 530 nm | 49 nm | 5% |

TABLE 2-continued

| ZnSeTe/ZnS | Added element (third metal element) | Added amount (molar ratio) | emission wave-lengths | half widths of emission | internal quantum efficiency |
|---|---|---|---|---|---|
| Comparative Example 10 | Mn (added in core) | 2.2% | 596 nm | 58 nm | 32% |
| Comparative Example 11 | Al | 12.6% | 497 nm | 60 nm | 8% |

The reaction temperature during core particle formation is different among Comparative Example 7 to Comparative Example 9.

In Examples 8 and 9, similarly to Examples 1-7, the emission wavelength can be controlled without adjusting the diameter of the quantum dots, and the quantum dots having high luminous efficiency and good luminous properties were obtained.

Comparative Example 12

Step 5: Synthesis of $CuInS_2$ Core Particles 10 mL of 1-octadecene as a solvent, 5 mL of 1-dodecanethiol, 6.9 mg of copper (I) chloride, 15.4 mg of indium (III) acetate, and 40 mg of thiourea were put into a 100 mL three-necked flask, and degassing treatment was performed at 100° C. for 1 hour. After degassing, the inside of the flask was filled with nitrogen gas, and the reaction was carried out in a state where oxygen was blocked. The degassed solution was heated to 220° C. and held for 30 minutes to obtain $CuInS_2$ core particles.

Step 6: Synthesis of ZnS Shell Layer 0.1 mL of diethylzinc and 0.25 mL of 1-dodecanethiol were mixed with 10 mL of 1-octadecene, and this mixed solution was added dropwise to the solution of $CuInS_2$ core particles obtained in step 5 under a temperature condition of 250° C. stirred for 30 minutes. As a result, a $CuInS_2$/ZnS core-shell type quantum dot solution was obtained.

5 times by volume of acetone was added to the quantum dot solution after the reaction to precipitate the quantum dots, and a centrifuge was used to perform centrifugation at 10000 rpm for 10 minutes, and the recovered precipitate was redispersed in toluene. The quantum dots were purified.

As a result of measuring the luminous properties of the quantum dots thus obtained, the emission wavelength was 658 nm, the half width of emission was 75 nm, and the internal quantum efficiency was 71%.

Example 10

After the same step 5 as in Comparative Example 12, 10 mg of anhydrous gallium (III) chloride and 20 mL of 1-octadecene were mixed and degassed at 150° C. for 1 hour to prepare a gallium solution in which anhydrous gallium chloride was dissolved. Then, 1 mL of this solution was added dropwise to the solution in which core particles were synthesized by the same step 5 as in Comparative Example 12, while maintaining the temperature of the solution at 200° C., and the mixture was stirred at 200° C. for 30 minutes to adsorb Ga atoms to the surface of the core particles. Then, the same treatment as in step 6 above was carried out to obtain $CuInS_2$/ZnS core-shell type quantum dots in which Ga was added to the core-shell interface. As a result of measuring the luminous properties of the quantum dots thus obtained, the emission wavelength was 632 nm, the half width of emission was 59 nm, and the internal quantum efficiency was 74%.

Example 11

After the same step 5 as in Comparative Example 12, 1 mg of anhydrous iron (II) chloride, 2 mL of oleylamine, and 18 mL of 1-octadecene were mixed and degassed at 150° C. for 1 hour to prepare a solution in which anhydrous iron chloride was dissolved. 1 mL of this solution was added dropwise to the solution in which the core particles were synthesized by the same step 5 as in Comparative Example 12, while maintaining the temperature of the solution at 200° C., and the mixture was stirred at 200° C. for 30 minutes to adsorb Fe atoms to the surface of the core particles. Then, the same treatment as in step 6 above was carried out to obtain $CuInS_2$/ZnS core-shell type quantum dots in which Fe was added to the core-shell interface. As a result of measuring the luminous properties of the quantum dots thus obtained, the emission wavelength was 689 nm, the half width of emission was 77 nm, and the internal quantum efficiency was 72%.

Comparative Example 13

$CuInS_2$/ZnS core-shell type quantum dots were synthesized under the same conditions except that the synthesis temperature of the core particles in step 5 of Comparative Example 12 was changed to 250° C. As a result of measuring the luminous properties of the quantum dots thus obtained, the emission wavelength was 661 nm, the half width of emission was 91 nm, and the internal quantum efficiency was 70%.

Comparative Example 14

$CuInS_2$/ZnS core-shell type quantum dots were synthesized under the same conditions except that the synthesis temperature of the core particles in step 5 of Comparative Example 12 was changed to 190° C. As a result of measuring the luminous properties of the quantum dots thus obtained, the emission wavelength was 655 nm, the half width of emission was 73 nm, and the internal quantum efficiency was 50%.

Comparative Example 15

10 mL of 1-octadecene as a solvent, 5 mL of 1-dodecanethiol, 6.9 mg of copper (I) chloride, 15.4 mg of indium (III) acetate, 40 mg of thiourea and 0.5 mg of anhydrous gallium (III) chloride were put into a 100 mL three-necked flask and degassing treatment was performed at 100° C. for 1 hour. After degassing, the inside of the flask was filled with nitrogen gas, and the reaction was carried out in a state where oxygen was blocked. The degassed solution was heated to 220° C. and held for 30 minutes to obtain CuInS$_2$ core particles. A ZnS shell layer was formed on the obtained core particles under the same conditions as in step 6 of Comparative Example 12. As a result, CuInS$_2$/ZnS quantum dots in which Ga atoms were added into the core particles were obtained. As a result of measuring the luminous properties of the quantum dots thus obtained, the emission wavelength was 618 nm, the half width of emission was 89 nm, and the internal quantum efficiency was 53%.

Comparative Example 16

In Example 10, the reaction was carried out under the same conditions as in Example 10 except that the amount of gallium solution added was changed to 3 mL, to obtain CuInS$_2$/ZnS quantum dots in which Ga was added to the core-shell interface. As a result of measuring the luminous properties of the quantum dots thus obtained, the emission wavelength was 643 nm, the half width of emission was 102 nm, and the internal quantum efficiency was 65%.

The results of Examples 10 and 11 and Comparative Examples 12-16 are shown in Table 3.

TABLE 3

| CuInS$_2$/Zns | Added element (third metal element) | Added amount (molar ratio) | emission wave-lengths | half widths of emission | internal quantum efficiency |
|---|---|---|---|---|---|
| Comparative Example 12 | None | — | 658 nm | 75 nm | 71% |
| Example 10 | Ga | 4.1% | 632 nm | 59 nm | 74% |
| Example 11 | Fe | 0.6% | 689 nm | 77 nm | 72% |
| Comparative Example 13 | None | — | 661 nm | 91 nm | 70% |
| Comparative Example 14 | None | — | 655 nm | 73 nm | 50% |
| Comparative Example 15 | Ga (added in core) | 4.1% | 618 nm | 89 nm | 53% |
| Comparative Example 16 | Ga | 12.2% | 643 nm | 102 nm | 65% |

The reaction temperature during core particle formation is different among Comparative Example 12 to Comparative Example 14.

In Examples 10 and 11, similarly to Examples 1-9, the emission wavelength can be controlled without adjusting the diameter of the quantum dots, and the quantum dots having high luminous efficiency and good luminous properties were obtained.

Comparative Example 17

Step 7: Synthesis of AgInS$_2$ Core Particles 10 mL of oleylamine as a solvent, 49 mg of silver (I) acetate, 65 mg of indium (III) acetate, 1.2 mL of 1-dodecanethiol, and 12 g of thiourea were put into a 100 mL three-necked flask and degassing treatment was performed at 100° C. for 30 minutes. After degassing, the inside of the flask was filled with nitrogen gas, and the reaction was carried out in a state where oxygen was blocked. AgInS$_2$ core particles were obtained by heating the degassed solution to 150° C. and holding it for 30 minutes.

Step 8: Formation of Ga$_2$S$_3$ Shell Layer 80 mg of gallium (III) acetylacetone and 24 mg of 1,3-dimethylthiourea were added to the solution of AgInS$_2$ core particles obtained in step 7, and the solution was heated to 280° C. and stirred for 30 minutes. As a result, an AgInS$_2$/Ga$_2$S$_3$ core-shell quantum dot solution was obtained.

5 times by volume of acetone was added to the quantum dot solution after the reaction to precipitate the quantum dots, and a centrifuge was used to perform centrifugation at 10000 rpm for 10 minutes, and the recovered precipitate was redispersed in toluene. The quantum dots were purified.

As a result of measuring the luminous properties of the quantum dots thus obtained, the emission wavelength was 596 nm, the half width of emission was 40 nm, and the internal quantum efficiency was 61%.

Example 12

After the same step 7 as in Comparative Example 17, 11 mg of bismuth (III) chloride, 13 mg of tin (II) iodide, 2 mL of oleylamine, and 18 mL of 1-octadecene were mixed, degassed at 150° C. for 1 hour to prepare a solution in which bismuth chloride and tin iodide were dissolved. 1 mL of this solution was added dropwise to the solution in which the core particles were synthesized by the same step 7 as in Comparative Example 17 while maintaining the temperature of the solution at 150° C., and the mixture was stirred at 150° C. for 30 minutes to adsorb Bi and Sn atoms on the surface of the core particles. Then, the same treatment as in Step 8 was carried out to obtain AgInS$_2$/Ga$_2$S$_3$ quantum dots in which Bi and Sn were added to the core-shell interface. As a result of measuring the luminous properties of the quantum dots thus obtained, the emission wavelength was 578 nm, the half width of emission was 36 nm, and the internal quantum efficiency was 62%.

Example 13

After the same step 7 as in Comparative Example 17, 10 g of molybdenum (III) chloride, 2 mL of oleylamine, and 18 mL of 1-octadecene were mixed and degassed at 150° C. for 1 hour to prepare a solution in which molybdenum chloride was dissolved. 2 mL of this solution was added dropwise to the solution in which the core particles were synthesized by the same step 7 as in Comparative Example 17 while maintaining the temperature of the solution at 150° C., and the mixture was stirred at 150° C. for 30 minutes to adsorb Mo atoms to the surface of the core particles. Then, the same treatment as in the above step 8 was carried out to obtain AgInS$_2$/Ga$_2$S$_3$ quantum dots in which Mo was added to the core-shell interface. As a result of measuring the luminous properties of the quantum dots thus obtained, the emission wavelength was 608 nm, the half width of emission was 41 nm, and the internal quantum efficiency was 60%.

Example 14

After step 7 similar to Comparative Example 17, 50 mg of anhydrous zinc (II) acetate, 1 mL of oleylamine, 1 mL of oleic acid, and 18 mL of 1-octadecene are mixed and degassed at 150° C. for 1 hour to prepare a zinc solution in which anhydrous zinc acetate was dissolved. 2 mL of this solution was added dropwise to the solution in which the core particles were synthesized by the same step 7 as in Comparative Example 17 while maintaining the temperature of the solution at 150° C., and the mixture was stirred at 150° C. for 30 minutes to adsorb Zn atoms to the surface of the core particles. Then, the same treatment as in step 8 above was carried out to obtain $AgInS_2/Ga_2S_3$ quantum dots in which Zn was added to the core-shell interface. As a result of measuring the luminous properties of the quantum dots thus obtained, the emission wavelength was 588 nm, the half width of emission was 38 nm, and the internal quantum efficiency was 77%.

Comparative Example 18

$AgInS_2/Ga_2S_3$ core-shell quantum dots were synthesized under the same conditions except that the synthesis temperature of the core particles in step 7 of Comparative Example 17 was changed to 180° C.

As a result of measuring the luminous properties of the quantum dots obtained by the above steps, the emission wavelength was 599 nm, the half width of emission was 67 nm, and the internal quantum efficiency was 60%.

Comparative Example 19

$AgInS_2/Ga_2S_3$ core-shell quantum dots were synthesized under the same conditions except that the synthesis temperature of the core particles in step 7 of Comparative Example 17 was changed to 120° C. As a result of measuring the luminous properties of the quantum dots thus obtained, the emission wavelength was 582 nm, the half width of emission was 59 nm, and the internal quantum efficiency was 59%.

Comparative Example 20

10 mL of oleylamine as a solvent, 49 mg of silver (I) acetate, 65 mg of indium (III) acetate, 1.2 mL of 1-dodecanethiol, 12 g of thiourea and 5 mg of anhydrous zinc (II) acetic acid were put into a 100 mL three-necked flask and degassing treatment was performed at 100° C. for 30 minutes. After degassing, the inside of the flask was filled with nitrogen gas, and the reaction was carried out in a state where oxygen was blocked. $AgInS_2$ core particles were obtained by heating the degassed solution to 150° C. and holding it for 30 minutes. A $Ga_2S_3$ shell layer was formed on the obtained core particles under the same conditions as in step 8 of Comparative Example 17. As a result, $AgInS_2/Ga_2S_3$ quantum dots in which Zn atoms were added into the core particles were obtained. As a result of measuring the luminous properties of the quantum dots thus obtained, the emission wavelength was 592 nm, the half width of emission was 70 nm, and the internal quantum efficiency was 75%.

Comparative Example 21

In Example 14, the reaction was carried out under the same conditions as in Example 14 except that the amount of zinc solution added was changed to 3 mL, to obtain $AgInS_2/Ga_2S_3$ quantum dots in which Zn was added to the core-shell interface. As a result of measuring the luminous properties of the quantum dots thus obtained, the emission wavelength was 608 nm, the half width of emission was 50 nm, and the internal quantum efficiency was 70%.

The results of Examples 12-14 and Comparative Example 17-21 are shown in Table 4.

TABLE 4

| $AgInS_2/Ga_2S_3$ | Added element (third metal element) | Added amount (molar ratio) | emission wavelengths | half widths of emission | internal quantum efficiency |
|---|---|---|---|---|---|
| Comparative Example 17 | None | — | 596 nm | 40 nm | 61% |
| Example 12 | Bi + Sn | 0.6% | 578 nm | 36 nm | 62% |
| Example 13 | Mo | 1.7% | 608 nm | 41 nm | 60% |
| Example 14 | Zn | 9.3% | 588 nm | 38 nm | 77% |
| Comparative Example 18 | None | — | 599 nm | 67 nm | 60% |
| Comparative Example 19 | None | — | 582 nm | 59 nm | 59% |
| Comparative Example 20 | Zn (added in core) | 9.3% | 592 nm | 70 nm | 75% |
| Comparative Example 21 | Zn | 13.9% | 608 nm | 50 nm | 70% |

The reaction temperature during core particle formation is different among Comparative Example 17 to Comparative Example 19.

In Examples 12-14, as in Example 1-11, the emission wavelength can be controlled without adjusting the diameter of the quantum dots, and the quantum dots having high luminous efficiency and good luminous properties were obtained.

The present invention is not limited to the above embodiment. The above-described embodiment is just examples, that substantially have the same feature and demonstrate the same functions and effects as those in the technical concept disclosed in claims of the present invention are included in the technical scope of the present invention.

The invention claimed is:
1. A quantum dot comprising fluorescent crystalline nanoparticle, wherein
the quantum dot has a core-shell structure including a core particle containing a first metal element and a shell layer containing a second metal element, at an interface between the core particle and the shell layer, a third metal element different from the first metal element and the second metal element is present, an amount of the third metal element with respect to an amount of the first metal element contained in the core particle is 10% or less in terms of molar ratio, the third metal element is at least one selected from Al, Ga, Ge, Si, Bi, Cs, Sn, Li, Na, K, Ca, and Mg, and the core particle is selected from ZnTe, $CuInS_2$, and $AgInS_2$.

2. The quantum dot according to claim 1, wherein the quantum dot does not contain Cd (cadmium).

3. A wavelength conversion material containing the quantum dot according to claim 1.

4. A wavelength conversion material containing the quantum dot according to claim 2.

5. A backlight unit comprising the wavelength conversion material according to claim 3.

6. An image display device including the backlight unit according to claim 5.

7. A method for producing a quantum dot comprising fluorescent crystalline nanoparticle, and having a core-shell structure including a core particle containing a first metal element and a shell layer containing a second metal element, the method comprising:

a step of forming the core particle;

a step of adsorbing a third metal element different from the first metal element and the second metal element on a surface of the core particle; and a step of forming the shell layer on the third metal element on the surface of the core particle, wherein an amount of the third metal element with respect to an amount of the first metal element contained in the core particle is set to 10% or less in terms of molar ratio in the step of adsorbing the third metal element, the third metal element is at least one selected from Al, Ga, Ge, Si, Bi, Cs, Sn, Li, Na, K, Ca, and Mg, and the core particle is selected from ZnTe, $CuInS_2$, and $AgInS_2$.

8. The method for producing a quantum dot according to claim 7, wherein a reaction temperature in the step of adsorbing the third metal element is set to be equal to or lower than a reaction temperature in the step of forming the core particle.

9. The quantum dot according to claim 1, wherein the shell layer is selected from AlP, AlN, $Ga_2S_3$, MgSe, and MgS.

10. The method for producing a quantum dot according to claim 7, wherein the shell layer is selected from AlP, AlN, $Ga_2S_3$, MgSe, and MgS.

* * * * *